(12) United States Patent
Fainzilber et al.

(10) Patent No.: US 11,057,059 B1
(45) Date of Patent: Jul. 6, 2021

(54) CONTENT AWARE BIT FLIPPING DECODER

(71) Applicant: Western Digital Technologies, Inc., San Jose, CA (US)

(72) Inventors: Omer Fainzilber, Herzeliya (IL); David Avraham, Even Yehuda (IL); Ran Zamir, Ramat Gan (IL)

(73) Assignee: WESTERN DIGITAL TECHNOLOGIES, INC., San Jose, CA (US)

( * ) Notice: Subject to any disclaimer, the term of this patent is extended or adjusted under 35 U.S.C. 154(b) by 0 days.

(21) Appl. No.: 16/744,061

(22) Filed: Jan. 15, 2020

(51) Int. Cl.
| H03M 13/45 | (2006.01) |
| H03M 13/11 | (2006.01) |
| G06F 11/10 | (2006.01) |

(52) U.S. Cl.
CPC ....... *H03M 13/458* (2013.01); *G06F 11/1068* (2013.01); *H03M 13/1102* (2013.01)

(58) Field of Classification Search
CPC .................................................. H03M 13/458
USPC ................................ 714/764, 762, 763, 766
See application file for complete search history.

(56) References Cited

U.S. PATENT DOCUMENTS

| 2014/0068393 A1 | 3/2014 | Varnica et al. |
| 2018/0343017 A1 | 11/2018 | Kumar et al. |
| 2019/0393901 A1 | 12/2019 | Fainzilber et al. |
| 2020/0099402 A1 | 3/2020 | Avraham et al. |
| 2020/0099404 A1 | 3/2020 | Avraham et al. |

OTHER PUBLICATIONS

On the error correction of regular LDPC codes using the flipping algorithm Burshtein, David. IEEE International Symposium on Information Theory—Proceedings: 226-230. Institute of Electrical and Electronics Engineers Inc. (Jan. 1, 2007) (Year: 2007).*
International Search Report and Written Opinion issued in corresponding International Application No. PCT/US2020/034728, dated Aug. 13, 2020 (8 pages).

* cited by examiner

*Primary Examiner* — Fritz Alphonse
(74) *Attorney, Agent, or Firm* — Patterson & Sheridan, LLP; Steven H. Versteeg (57) ABSTRACT

Examples described herein relate generally to content aware bit flipping decoders. An example device includes a decoder. The decoder is configured to: process one or more flip thresholds based on statistics of data to be decoded; and perform a bit flipping algorithm on the data using the one or more processed flip thresholds. Other examples relate to methods of processing one or more flip thresholds based on statistics of data to be decoded and performing a bit flipping algorithm on the data using the one or more processed flip thresholds.

20 Claims, 7 Drawing Sheets

FIG. 1

BYTES OF A TEXT FILE IN ASCII FORMAT

CONTENT AWARE BIT FLIPPING DECODER

BACKGROUND

Field of the Disclosure

Embodiments of the present disclosure generally relate to data decoding. More specifically, aspects of the disclosure relate to content aware decoding methods and systems, such as for computer applications.

Description of the Related Art

Reliability of flash memories, such as solid state drives (SSDs), is a key factor that distinguishes these drives from other conventional memory arrangements. Such SSDs are required to have long term endurance and memory capabilities, especially at end of drive service life.

In order to achieve high reliability, the data stored on the flash memory is protected such that it may be recovered, in case of a malfunction. The recovery systems may vary, but one of the most typical is a protection using an Error Code Correction (ECC) code. Most often, ECC codes include low density parity check (LDPC) codes.

ECC decoders have several features that allow the decoder to increase its performance. ECC decoders are programmed to read data and by knowing underlying statistics of the data to be decoded, more accurate predictions for recovery can be made. In instances where an underlying statistic is not known, the ECC may use default parameters which may correspond to a case of uniform distribution of data.

Of course, such decoding can take time, which can impact the performance of the memory. If there are fewer errors (e.g., a lower Bit Error Rate (BER)), then decoder throughput may be improved. Accordingly, it would be advantageous to have a memory with improved throughput.

SUMMARY

Examples described herein relate generally to content aware bit flipping decoders. An example is a device. The device includes a decoder configured to: process one or more flip thresholds based on statistics of data to be decoded; and perform a bit flipping algorithm on the data using the one or more processed flip thresholds.

Another example is a device. The device includes a decoder configured to: obtain data; determine statistics of the data; adjust one or more flip thresholds based on the data statistics; perform check equations on the data; and flip one or more bit values of the data based on the one or more flip thresholds and results of the check equations.

Another example is a device. The device includes means for obtaining data; means for generating statistics of the data; means for processing one or more flip thresholds based on the data statistics; and means for performing a bit flipping algorithm on the data based on the processed one or more flip thresholds.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only examples of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one example may be beneficially utilized on other examples without specific recitation.

DETAILED DESCRIPTION

In the following, reference is made to various examples described in this disclosure. However, it should be understood that the disclosure is not limited to specific described examples. Instead, any combination of the following features and elements, whether related to different examples or not, is contemplated to implement and practice the disclosure. Furthermore, although examples may achieve advantages over other possible solutions and/or over the prior art, whether or not a particular advantage is achieved by a given example is not limiting of the disclosure. Thus, the following aspects, features, embodiments and advantages are merely illustrative and are not considered elements or limitations of the appended claims except where explicitly recited in a claim(s). Likewise, reference to "the disclosure" shall not be construed as a generalization of any inventive subject matter disclosed herein and shall not be considered to be an element or limitation of the appended claims except where explicitly recited in a claim(s).

Examples described herein relate generally to content aware bit flipping decoders. An example is a device. The device includes a decoder configured to: process one or more flip thresholds based on statistics of data to be decoded; and perform a bit flipping algorithm on the data using the one or more processed flip thresholds. Other examples relate to methods of processing one or more flip thresholds based on statistics of data to be decoded and performing a bit flipping algorithm on the data using the one or more processed flip thresholds.

Figure 1:
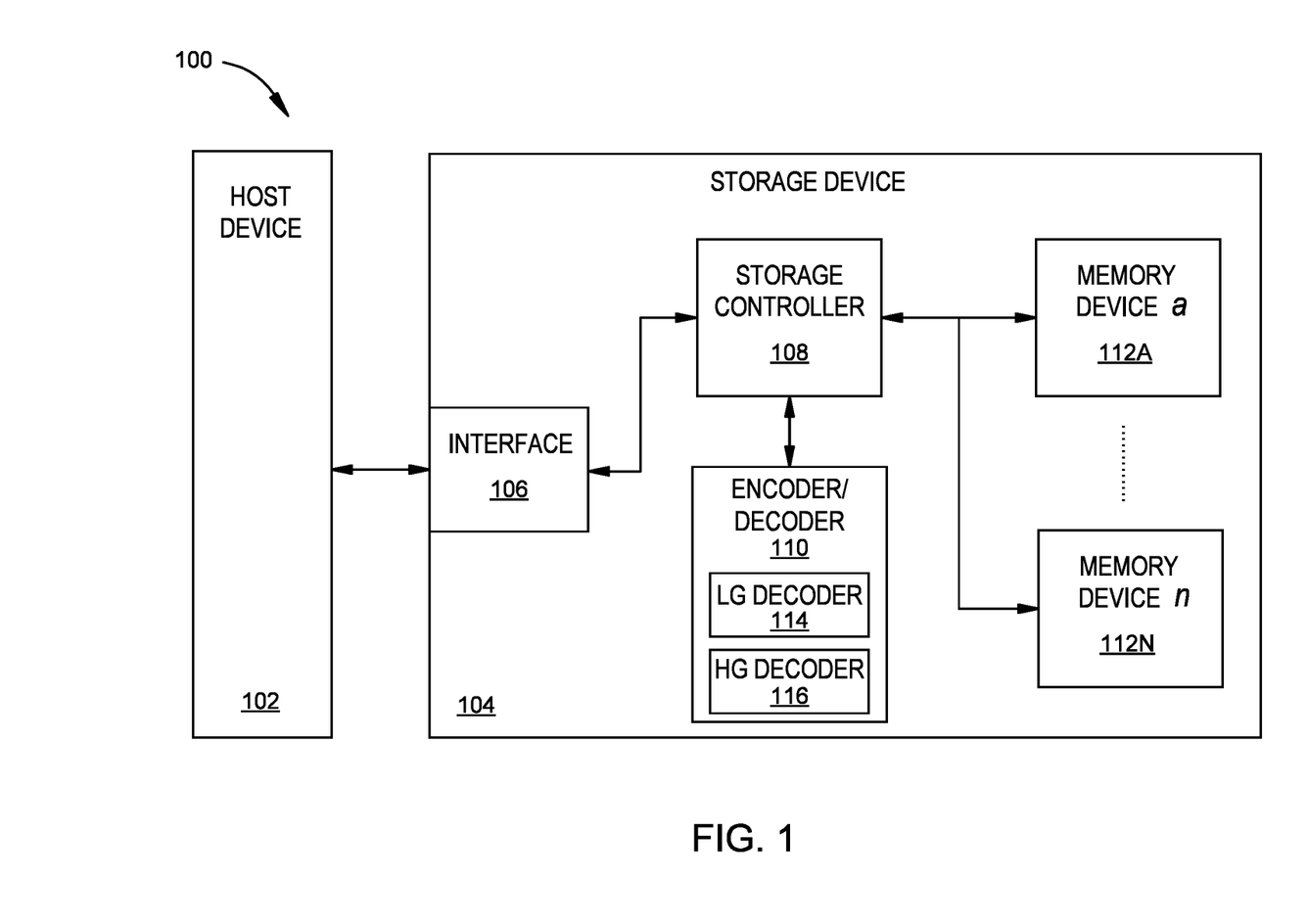
FIG. 1 is a schematic block diagram of a host device and storage device with accompanying interface and decoder.

FIG. 1 illustrates a schematic block diagram 100 of a host device 102 and a storage device 104. The storage device 104 includes a storage controller 108, an encoder/decoder 110, and one or more memory devices a-n 112A-112N (individually or collectively, memory device 112). Data may be sent and received through the interface 106 between the host device 102 and the storage device 104. The interface 106 is configured to interface with the host device 102, namely accept data and/or command requests as provided by the host device 102 for processing by the storage device 104.

The storage controller 108 is configured to control a flow of data between the various components of the storage device 104. The storage controller 108 can direct data received from the interface 106 to the encoder/decoder 110 to encode the received data, and can receive encoded data from the encoder/decoder 110, which the storage controller 108 can cause to be written to the memory device 112. Similarly, the storage controller 108 can direct data read from the memory device 112 to the encoder/decoder 110 to decode the read data, and can receive decoded data from the encoder/decoder 110, which the storage controller 108 can cause to be transmitted to the interface 106 for communication to the host device 102. The storage controller 108 is further configured to transmit command sequences for read and write sequences to the memory device 112. The storage controller 108 can be configured to perform other tasks, such as formatting the memory device 112, mapping out bad memory cells of the memory device 112, allocating spare cells to be substituted for future failed memory cells, translating between logical and physical addresses of the memory device 112, wear leveling, garbage collection, etc. In the illustrated examples, the storage device 104 may be a single or number of SSDs for storage of information.

The storage controller 108 can be or include processing circuitry or a processor (with a computer-readable medium that stores computer-readable program code (e.g., firmware) executable by the processor), logic circuitry, an application specific integrated circuit (ASIC), a programmable logic controller, an embedded microcontroller, a combination thereof, or the like, for example. The storage controller 108 can be configured with hardware and/or firmware to perform various functions.

The encoder/decoder 110 includes a low gear (LG) decoder 114 and a high gear (HG) decoder 116. The LG decoder 114 can implement low power bit flipping algorithms, such as a low density parity check (LDPC) algorithm. The LG decoder 114 may be operable to decode data and correct bit flips where such data has a low bit error rate (BER). The HG decoder 116 can implement full power decoding and error correction algorithms, which may be initiated upon a failure of the LG decoder 114 to decode and correct bit flips in data. The HG decoder 116 can be operable to correct bit flips where such data has a high BER. Accordingly, the LG decoder 114 and HG decoder 116 can implement gear shifting.

The encoder/decoder 110 (including the LG decoder 114 and HG decoder 116) can be or include processing circuitry or a processor (with a computer-readable medium that stores computer-readable program code (e.g., firmware) executable by the processor), logic circuitry, an application specific integrated circuit (ASIC), a programmable logic controller, an embedded microcontroller, a combination thereof, or the like, for example. The encoder/decoder 110 can be configured with hardware and/or firmware to perform various functions described below and shown in the flow diagrams. In some examples, the encoder/decoder 110 is separate from the storage controller 108, and in other examples, the encoder/decoder 110 is embedded in or part of the storage controller 108. In some examples, the LG decoder 114 is a hardened circuit, such as logic circuitry, an ASIC, or the like. In some examples, the HG decoder 116 can be a soft decoder (e.g., implemented by a processor).

More often, data that is to be decoded by the encoder/decoder 110 will have a low BER. The LG decoder 114 therefore can implement low power and low latency decoding to decode data with a low BER. By employing such decoding by the LG decoder 114, latency and power consumption of the encoder/decoder 110 can be decreased. Further, a hardened circuit of the LG decoder 114, according to some examples, can have significantly less area on a die and consume much less power than a soft decoder, such as 16 times less area and 12-16 times less power. As described in further detail below, the LG decoder 114 being aware of statistics of the data can further decrease latency and increase decoding capability of the LG decoder 114.

The memory device 112 may include any suitable volatile or non-volatile storage medium. For example, the memory device 112 can be or include a non-volatile storage medium, such as NAND flash memory cells and/or NOR flash memory cells. In some examples, the memory cells can take the form of solid-state (e.g., flash) memory cells and can be one-time programmable, few-time programmable, or many-time programmable. The memory cells can also be single-level cells (SLC), multiple-level cells (MLC), triple-level cells (TLC), or use other memory cell level technologies, now known or later developed.

The various components of the storage device 104 can be embodied in one or more different dies, which may be included in a package or module. For example, the interface 106, storage controller 108, and encoder/decoder 110 can be embodied on a single die, and each memory device 112 can be embodied on a respective different die. Any number of different dies can be implemented. The dies, and components thereon, can be communicatively coupled via a substrate to which the dies are attached. The substrate can be or include an interposer, a package substrate, a combination thereof, or the like.

Aspects of the disclosure use the components described in FIG. 1 to enable execution of several methods to utilize data in a decoder, which can lead to an increase in the correction capability and reduction in the decoding latency and power consumption. The aspects of the disclosure may use structure, found in the data itself, to enable more efficient decoding.

In many cases, data written to memory, such as flash memory, like NAND based SSDs, has structure to it. The structure can be a property of a user source (e.g., if the saved data is textual in origin). In some examples, the structure can be a property of the way the memory is used (e.g., tables written by the firmware, data padded with zeros, etc.). Utilizing characteristics of such structures in the decoding process can yield reduced latency and improved correction than attempting to perform error correction without using such characteristics.

Figure 2:
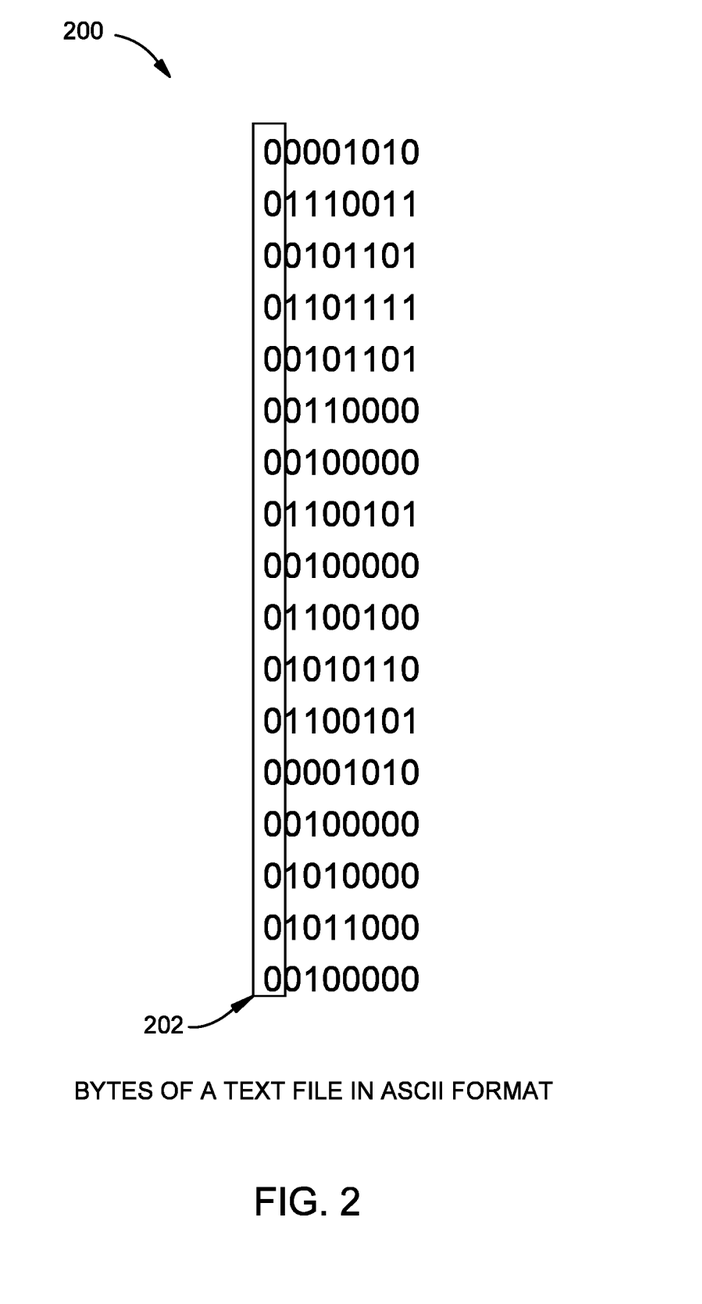
FIG. 2 is a portion of a text file in ASCII format.

Knowing the underlying statistics of the data may help the decoder to more efficiently obtain correct results when decoding data compared to conventional methods which do not use such methods. FIG. 2 illustrates a portion of a text file 200 in ASCII format. Each character in ASCII is a byte and the most common characters only occupy the seven (7) least significant bits of the byte. This causes the most significant bit 202 of the bytes of these most common characters to be '0'. Hence, the probability that the most significant bit of any byte stored within the data to be '0' is high. If a byte to be decoded has a '1' in the most significant bit, it can be assumed that there is a high likelihood that the value of that bit is erroneous. Examples described herein utilize such probability to decrease or increase a flip threshold for a bit location used in a flipping algorithm when a probability that the bit value is an error or is correct is beyond a confidence threshold.

Generally, in some examples, read data is transferred, under the control of the storage controller 108, from a memory device 112 into the encoder/decoder 110. The encoder/decoder 110 (e.g., the LG decoder 114) generates statistics, such as probability difference metrics based on the data, e.g., on the fly as the data is transferred into the encoder/decoder 110. The LG decoder 114 processes, based on the statistics (e.g., probability difference metrics), one or more flip thresholds for respective bit locations used in a flipping algorithm. The processing a flip threshold can increase or decrease a value of the flip threshold. The LG decoder 114 performs the flipping algorithm, which calculates parity check equation satisfaction and can decode the data. The flipping algorithm uses the one or more flip thresholds that were processed.

Figure 3:
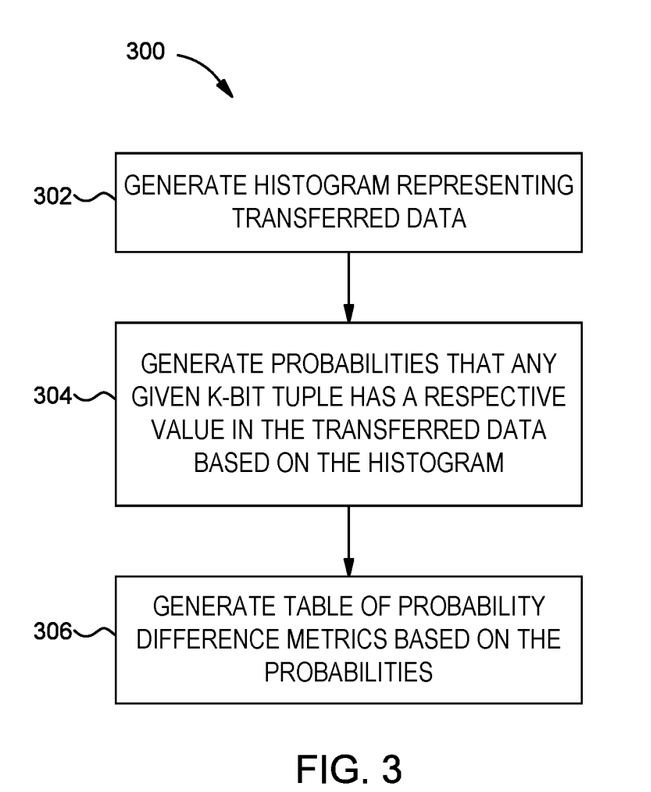
FIG. 3 is a flow chart of a method for generating probability difference metrics of data to be decoded.

FIG. 3 is a flow chart 300 of a method for generating statistics (e.g., probability difference metrics in this example) of data to be decoded according to some examples. At block 302, a histogram representing the data transferred to the encoder/decoder 110 is generated. The transferred data is data to be decoded, which can be read from a memory device 112. In some examples, the histogram counts the number of occurrences of a respective K-bit sequence (e.g., a K-bit tuple) in the data. As examples herein and for ease, the histogram counts the number of K-bit tuples that are represented as decimal values, although the values can be represented by any base format (e.g., binary, hexadecimal, etc.). The histogram can include a bin for each possible value represented by K-bits, and a bin corresponding to a value can be incremented for each instance a K-bit tuple in the data having that value such that the histogram maintains a count of the number of K-bit tuples that have the corresponding value. For example, the histogram can include a value set V, where bins $v_j \in V$ and a value j is a decimal value $[0, \ldots, 2^K-1]$. The value of any bin $v_j$ is the number of instances of K-bit tuples in the transferred data that have value j.

At block 304, probabilities that any given K-bit tuple in the transferred data has a respective value are generated based on the histogram. Continuing the foregoing example, a probability $p_j$ that any given K-bit tuple in the transferred data has a value j can be calculated as:

$$p_j = \frac{v_j}{\sum_{i=0}^{2^K-1} v_i} \; \forall \; j.$$

At block 306, a table of probability difference metrics is generated based on the probabilities. A table T includes probability difference metrics $t_{m,n} \in T$, where n indicates a bit location in a K-bit tuple and m is the value of the binary representation of the K-bit tuple without the bit value b[n] at bit location n (e.g., a value of a (K−1)-bit tuple). Each probability difference metric $t_{m,n}$ is a metric that represents the difference between the respective probabilities $p_j$ that any given K-bit tuple has the two values j obtained when the bit value b[n] is '0' and '1' and inserted at bit location n in the remaining (K−1)-bit tuple corresponding to the value m. As an example, with a 4-bit (e.g., K=4) tuple, an entry $t_{5,2}$ indicates a value of a (K−1)-bit tuple of 5 and a bit location of 2 in the K-bit tuple. The (K−1)-bit tuple is $b_{(K-1)}[0:3]$ =<101>$_2$=5=m. The two values obtained are 9 and 13. When a '0' is inserted at bit location 2, $b_K[0:4]$=<1001>$_2$=9, and when a '1' is inserted at bit location 2, $b_K[0:4]$=<1011>$_2$=13. Hence, the probability difference metric $t_{5,2}$ is a metric that represents the difference between the probability $p_9$ and the probability $p_{13}$. In some examples, the metric for the entries $t_{m,n}$ can be the difference between the two probabilities $p_j$ (e.g., $t_{5,2}=p_9-p_{13}$), a logarithm of a ratio of the two probabilities $$p_j \left(e.g., \; t_{5,2} = \log\left(\frac{p_9}{p_{13}}\right)\right),$$

or another metric. Table 1 below is an example table T for 4-bit tuples. Other examples can implement other metrics and/or be extended to different bit size tuples.

TABLE 1

| $b_{(K-1)}[0:3]_2 = m$ | n = 0 | n = 1 | n = 2 | n = 3 |
|---|---|---|---|---|
| <000>$_2$ = 0 | $t_{0,0}$ = $p_0 - p_1$ | $t_{0,1}$ = $p_0 - p_2$ | $t_{0,2}$ = $p_0 - p_4$ | $t_{0,3}$ = $p_0 - p_8$ |
| <100>$_2$ = 1 | $t_{1,0}$ = $p_2 - p_3$ | $t_{1,1}$ = $p_1 - p_3$ | $t_{1,2}$ = $p_1 - p_5$ | $t_{1,3}$ = $p_1 - p_9$ |
| <010>$_2$ = 2 | $t_{2,0}$ = $p_4 - p_5$ | $t_{2,1}$ = $p_4 - p_6$ | $t_{2,2}$ = $p_2 - p_6$ | $t_{2,3}$ = $p_2 - p_{10}$ |
| <110>$_2$ = 3 | $t_{3,0}$ = $p_6 - p_7$ | $t_{3,1}$ = $p_5 - p_7$ | $t_{3,2}$ = $p_3 - p_7$ | $t_{3,3}$ = $p_3 - p_{11}$ |
| <001>$_2$ = 4 | $t_{4,0}$ = $p_8 - p_9$ | $t_{4,1}$ = $p_8 - p_{10}$ | $t_{4,2}$ = $p_8 - p_{12}$ | $t_{4,3}$ = $p_4 - p_{12}$ |
| <101>$_2$ = 5 | $t_{5,0}$ = $p_{10} - p_{11}$ | $t_{5,1}$ = $p_9 - p_{11}$ | $t_{5,2}$ = $p_9 - p_{13}$ | $t_{5,3}$ = $p_5 - p_{13}$ |
| <011>$_2$ = 6 | $t_{6,0}$ = $p_{12} - p_{13}$ | $t_{6,1}$ = $p_{12} - p_{14}$ | $t_{6,2}$ = $p_{10} - p_{14}$ | $t_{6,3}$ = $p_6 - p_{14}$ |
| <111>$_2$ = 7 | $t_{7,0}$ = $p_{14} - p_{15}$ | $t_{7,1}$ = $p_{13} - p_{15}$ | $t_{7,2}$ = $p_{11} - p_{15}$ | $t_{7,3}$ = $p_7 - p_{15}$ |

As is apparent from Table 1, in this example, when a bit value b[n] has a higher probability of being '1' in any K-bit tuple having a given remaining (K−1)-bit tuple, the corresponding probability difference metric $t_{m,n}$ is negative, and when a bit value b[n] has a higher probability of being '0' in any K-bit tuple having a given remaining (K−1)-bit tuple, the corresponding probability difference metric $t_{m,n}$ is positive. The corresponding probability difference metric $t_{m,n}$ for the K-bit tuple is 0 when the probabilities are equal.

In decoding data, a flip threshold $F_{TH,k}$ for a bit location k of a K-bit tuple is processed based on the statistics, such as based on the probability difference metrics $t_{m,n}$ of the table T. Once processed, the flip threshold $F_{TH,k}$ is used in a bit flipping algorithm to determine whether to flip the corresponding bit value b[k] at the bit location k in the K-bit tuple based on a number of unsatisfied parity check equations in which the bit value b[k] at the bit location k in the K-bit tuple participates. Processing a flip threshold $F_{TH,k}$ and determining whether to flip the corresponding bit value b[k] can be iteratively performed until all parity check equations are satisfied resulting in decode success or until a decode failure condition is met. By processing flip thresholds $F_{TH,k}$, convergence of the parity check equations can be reached more quickly and with reduced latency. Additionally, by processing flip thresholds $F_{TH,k}$, correction capability of the decoding can be increased.

Figure 4A:
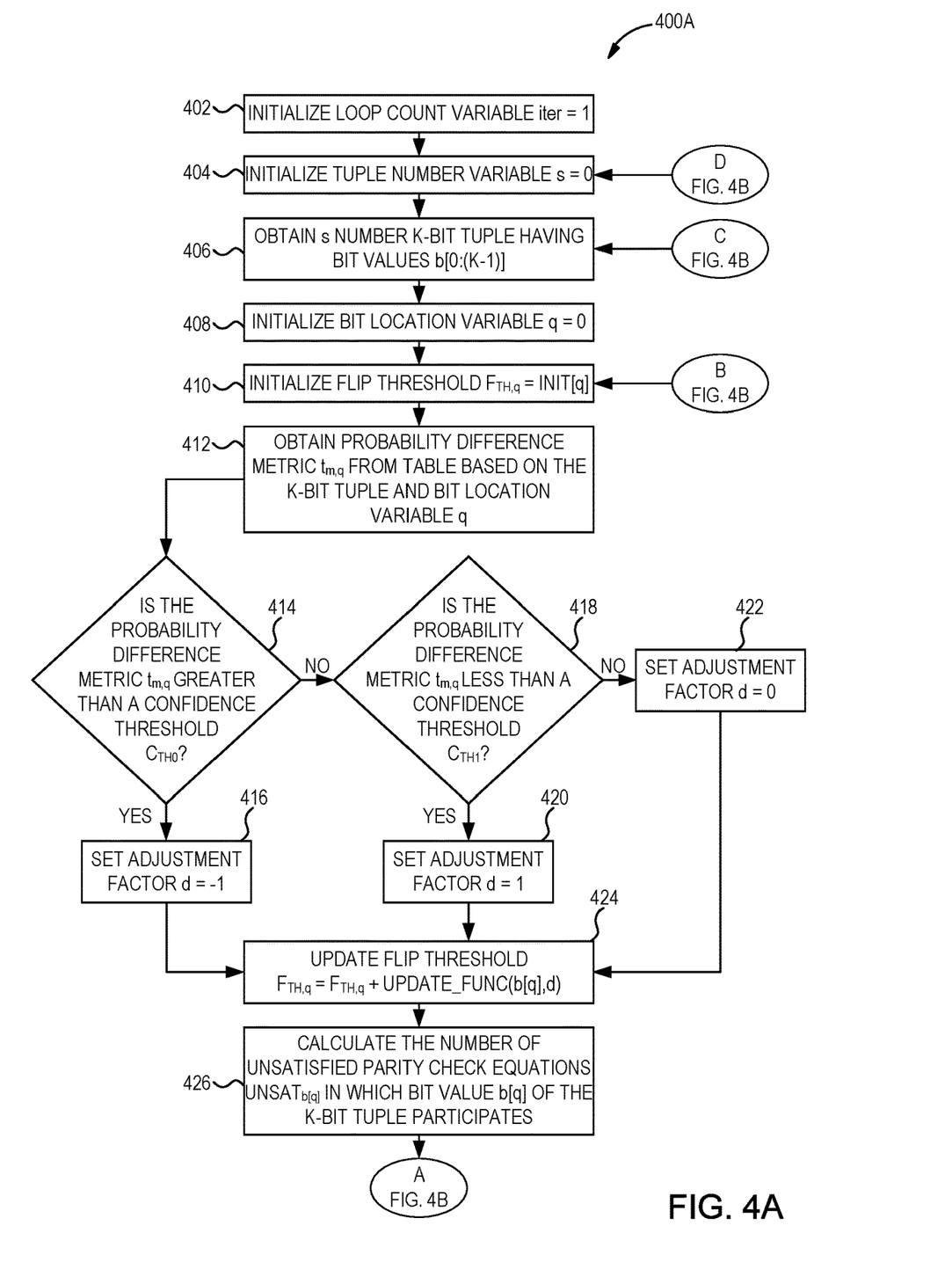
FIGS. 4A and 4B are a flow chart of a method for decoding data according to some examples.
Figure 4B:
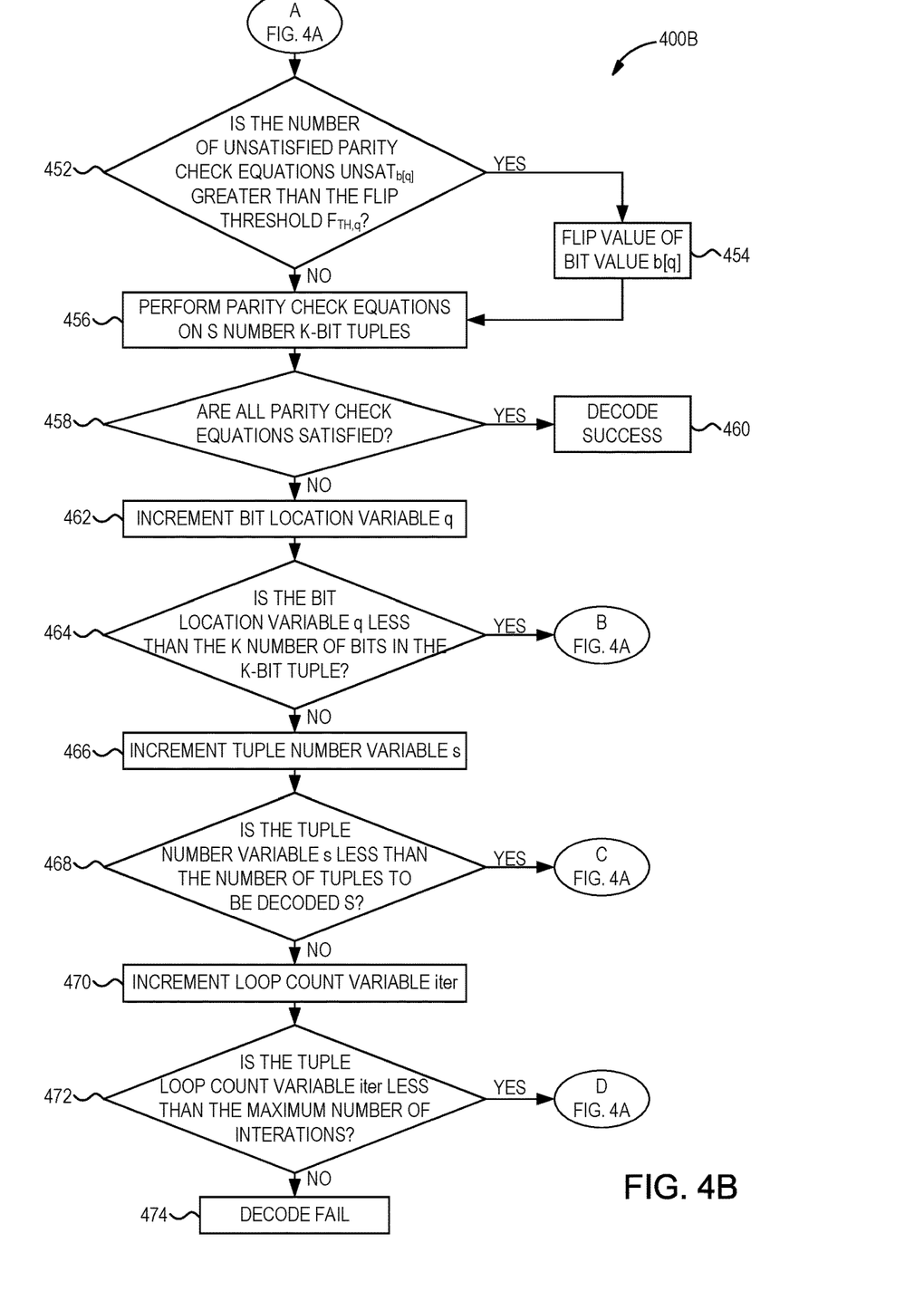

FIGS. 4A and 4B are a flow chart 400A, 400B of a method for decoding data according to some examples. Within the method for decoding data, one or more flip thresholds are processed, and a bit flipping algorithm is implemented.

The method for decoding data, as described herein, implements parity check equations. In some examples, the parity check equations implement a low-density parity-check (LDPC) code algorithm, such as by using a Gallager A or Gallager B algorithm. The parity check equations use an error correction code word with a length N. The error correction code word can have a corresponding set of M number of parity check equations. Each parity check equation can be a constraint on a subset of bits of the error correction code word. The number of K-bit tuples to be decoded (e.g., for a single implementation of the method for decoding data of FIGS. 4A and 4B) can have a relation to the error correction code word length N. The number of K-bit tuples to be decoded S is a ratio of the error correction code word length N to the K number of bits per K-bit tuple (e.g., S=N/K). Each parity check equation can have one or more bits of the S number of K-bit tuples as participant(s) in the parity check equation. If, when analyzed with the one or more bits of the S number of K-bit tuples and the corresponding subset of bits of the error correction code word, a parity check equation results in, e.g., a '0', the parity check equation can be said to be satisfied. If all parity check equations are satisfied, the S number of K-bit tuples induce a legal code word; otherwise, the S number of K-bit tuples do not induce a legal code word.

A bi-partite graph can be used to represent the error correction code word with the length N and the M number of parity check equations. The bi-partite graph includes variable nodes, check nodes, and edges connecting variable nodes and check nodes. Each variable node corresponds to a bit location of the error correction code word, and hence, N number of variable nodes are present in the bi-partite graph. Each check node corresponds to a parity check equation, and hence, M number of check nodes are present in the bi-partite graph. Each edge represents participation by the bit location of the error correction code represented by the variable node (and corresponding bit location of a K-bit tuple) in the parity check equation represented by the check node, where the edge connects the variable node to the check node. Each variable node can be connected to any number of check nodes by edges, and each check node can be connected to any number of variable nodes by edges.

Referring to FIG. 4A, at block 402, a loop count variable iter is initialized equal to one. At block 404, a tuple number variable s is initialized equal to zero. Generally, the tuple number variable s is an index for which K-bit tuple within the data to be decoded is being analyzed for error correction using an error correction code word with a length N. As will become apparent, the tuple number variable s can have a value from zero to one less than the number of tuples to be decoded S (e.g., $0 \leq s \leq S-1$).

At block 406, a s number K-bit tuple having bit values b[0: (K−1)] is obtained, e.g., from data transferred to the encoder/decoder 110. At block 408, a bit location variable q is initialized equal to zero. At block 410, a flip threshold $F_{TH,q}$ is initialized to a value. The value to which the flip threshold $F_{TH,q}$ is initialized can be arbitrary or can be based on the subsequently implemented parity check equations. For example, if, in the parity check, a bit location q participates in some number of parity check equations, the value to which the flip threshold $F_{TH,q}$ is initialized can be half of the number of the parity check equations in which the bit location q participates rounded up to the nearest integer. As examples, if the bit location q participates in 2 parity check equations, the value to which the flip threshold $F_{TH,q}$ is initialized can be 1, or if the bit location q participates in 3 parity check equations, the value to which the flip threshold $F_{TH,q}$ is initialized can be 2. In subsequent iterations for the same bit location q of the s number K-bit tuple, the flip threshold $F_{TH,q}$ can be initialized to the value of the flip threshold $F_{TH,q}$ determined in the previous iteration.

At block 412, a probability difference metric $t_{m,q}$ is obtained from the table T based on the K-bit tuple and the bit location variable q. The probability difference metric $t_{m,q}$ is identified based on the K-bit tuple and the bit location q like described above. In summary, the bit value b[q] at bit location q is removed from the K-bit tuple to create a remaining (K−1)-bit tuple (e.g., using the respective bit values of the K-bit tuple without the bit value b[q]), and the value m is determined from the remaining (K−1)-bit tuple.

At blocks 414-422, an adjustment factor d is set based on the probability difference metric $t_{m,q}$ and confidence thresholds $C_{TH0}$, $C_{TH1}$. The confidence thresholds $C_{TH0}$, $C_{TH1}$ are predefined. The confidence threshold $C_{TH0}$ is a threshold value that controls a confidence level that a bit value at any bit location of the K-bit tuple is more likely to have a value of '0', and the confidence threshold $C_{TH1}$ is a threshold value that controls a confidence level that a bit value at any bit location of the K-bit tuple is more likely to have a value of '1'. Generally, the value of the confidence threshold $C_{TH1}$ is less than the value of the confidence threshold $C_{TH0}$ (e.g., $C_{TH1} < C_{TH0}$). The confidence threshold $C_{TH0}$ can be a positive number less than or equal to one (e.g., $0 < C_{TH0} \leq 1$). The confidence threshold $C_{TH1}$ can be a negative number greater than or equal to negative one (e.g., $-1 \leq C_{TH1} < 0$). As described above, a probability difference metric $t_{m,n}$ is negative when a corresponding bit value b[n] has a higher probability of being '1' in any K-bit tuple having a given remaining (K−1)-bit tuple that has a value m. Further, the greater the magnitude of a negative value of a probability difference metric $t_{m,n}$ is, the greater confidence there is that the bit value b[n] is likely to be '1'. Additionally, a probability difference metric $t_{m,n}$ is positive when a corresponding bit value b[n] has a higher probability of being '0' in any K-bit tuple having a given remaining (K−1)-bit tuple that has a value m. Further, the greater the magnitude of a positive value of a probability difference metric $t_{m,n}$ is, the greater confidence there is that the bit value b[n] is likely to be '0'.

The adjustment factor d is set as follows:

$$d = \begin{cases} -1 : t_{m,q} > C_{TH0} \\ 1 : t_{m,q} < C_{TH1} \\ 0 : \text{otherwise} \end{cases}$$

Blocks 414-422 achieve setting the adjustment factor d in this manner. At block 414, a determination is made whether the probability difference metric $t_{m,q}$ is greater than the confidence threshold $C_{TH0}$. If so, at block 416, the adjustment factor d is set to negative one. This indicates that the bit value b[q] has a higher probability of having a value of '0' with a degree of confidence. The magnitude of the positive value of the probability difference metric $t_{m,q}$ is greater than and exceeds the magnitude of the positive value of the confidence threshold $C_{TH0}$. If the determination at block 414 is that the probability difference metric $t_{m,q}$ is not greater than the confidence threshold $C_{TH0}$, at block 418, a determination is made whether the probability difference metric $t_{m,q}$ is less than the confidence threshold $C_{TH1}$. If so, at block 420, the adjustment factor d is set to positive one. This indicates that the bit value b[q] has a higher probability of having a value of '1' with a degree of confidence. The magnitude of the negative value of the probability difference metric $t_{m,q}$ is greater than and exceeds the magnitude of the negative value of the confidence threshold $C_{TH1}$. If the determination at block 418 is that the probability difference metric $t_{m,q}$ is not less than the confidence threshold $C_{TH1}$, at block 422, the adjustment factor d is set to zero. This indicates that there is insufficient confidence that the bit value b[q] is likely to be any one of '0' or '1'.

After the adjustment factor d is set in one of blocks 416, 420, 422, at block 424, the flip threshold $F_{TH,q}$ is updated based on the bit value b[q] and the adjustment factor d. Generally, and as illustrated, the flip threshold $F_{TH,q}$ can be adjusted using an update function Update_Func(b[q], d). The flip threshold $F_{TH,q}$ can be increased or decreased by the update function Update_Func(b[q], d). For example, the flip threshold $F_{TH,q}$ can be adjusted as follows:

$$F_{TH,q}=F_{TH,q}+\text{Update\_Func}(b[q],d)$$

Table 2 below illustrates an example update function Update_Func(b[q], d).

TABLE 2

|     | b[q] | d  | Update_Func(b[q], d) |
|-----|------|----|----------------------|
| (1) | 1    | -1 | -1                   |
| (2) | 0    | -1 | 1                    |
| (3) | 1    | 1  | 1                    |
| (4) | 0    | 1  | -1                   |
| (5) | 1    | 0  | 0                    |
| (6) | 0    | 0  | 0                    |

The update function Update_Func(b[q], d) of Table 2 can be restated as follows:

$$\text{Update\_Func}(b[q],d)=d(2b[q]-1)$$

With respect to Line (1) in Table 2, the adjustment factor d is negative one, which indicates that the bit value b[q] has a higher probability of having a value of '0' with a degree of confidence. Since the bit value b[q] is '1', however, the flip threshold $F_{TH,q}$ is decreased by 1 (e.g., Update_Func(b[q],d)=-1). Decreasing the flip threshold $F_{TH,q}$ can permit the bit value b[q] to be more easily flipped during operation of the flipping algorithm.

With respect to Line (2) in Table 2, the adjustment factor d is negative one, which indicates that the bit value b[q] has a higher probability of having a value of '0' with a degree of confidence. Since the bit value b[q] is '0', the flip threshold $F_{TH,q}$ is increased by 1 (e.g., Update_Func(b[q], d)=1). Increasing the flip threshold $F_{TH,q}$ can prevent the bit value b[q] from be flipped during operation of the flipping algorithm.

With respect to Line (3) in Table 2, the adjustment factor d is positive one, which indicates that the bit value b[q] has a higher probability of having a value of '1' with a degree of confidence. Since the bit value b[q] is '1', the flip threshold $F_{TH,q}$ is increased by 1 (e.g., Update_Func(b[q], d)=1). Increasing the flip threshold $F_{TH,q}$ can prevent the bit value b[q] from be flipped during operation of the flipping algorithm.

With respect to Line (4) in Table 2, the adjustment factor d is positive one, which indicates that the bit value b[q] has a higher probability of having a value of '1' with a degree of confidence. Since the bit value b[q] is '0', however, the flip threshold $F_{TH,q}$ is decreased by 1 (e.g., Update_Func(b[q], d)=-1). Decreasing the flip threshold $F_{TH,q}$ can permit the bit value b[q] to be more easily flipped during operation of the flipping algorithm.

With respect to Lines (5) and (6) in Table 2, the adjustment factor d is zero, which indicates that there is insufficient confidence that the bit value b[q] is likely to be any one of '0' or T. Hence, the flip threshold $F_{TH,q}$ is unchanged (e.g., Update_Func(b[q], d)=0). It is also noted that, in this example, in the flow chart 400A, if the determination at block 418 is that the probability difference metric $t_{m,q}$ is not less than the confidence threshold $C_{TH1}$, the flow can proceed to block 426 since the flip threshold $F_{TH,q}$ is unchanged.

At block 426, the number of unsatisfied parity check equations $\text{UNSAT}_{b[q]}$ in which the bit value b[q] of the K-bit tuple participates is calculated. The parity check equations in which the bit value b[q] of the K-bit tuple participates are calculated (e.g., including using corresponding subset of bits of the error correction code word). The number of unsatisfied parity check equations $\text{UNSAT}_{b[q]}$ (e.g., parity check equations that do not equal zero) are then counted. Referring to FIG. 4B, at block 452, a determination is made whether the number of unsatisfied parity check equations $\text{UNSAT}_{b[q]}$ is greater than the flip threshold $F_T"$. If so, at block 454, the bit value b[q] in the K-bit tuple is flipped. For example, if initially b[q]=0, the bit value b[q] is flipped to be '1', and if initially b[q]=1, the bit value b[q] is flipped to be '0'. If the determination of block 452 is that the number of unsatisfied parity check equations $\text{UNSAT}_{b[q]}$ is not greater than the flip threshold $F_{TH,q}$, or subsequent to block 454, parity check equations are performed on S number K-bit tuples using the error correction code word having the length N at block 456.

At block 458, a determination is made whether all parity check equations are satisfied. If so, at block 460, a decode result of the S number K-bit tuples is obtained, and convergence is achieved. If at least one of the parity check equations is not satisfied, at block 462, the bit location variable q is incremented by one.

At block 464, a determination is made whether the bit location variable q is less than the K number of bits in the K-bit tuple. If so, the flow loops back to block 410 of FIG. 4A to analyze another bit location of the K-bit tuple. If not, at block 466, the tuple number variable s is incremented by one. The loop formed by looping the flow from block 464 to block 410 can permit the flow to analyze each bit within a s number K-bit tuple to attempt to reach a decode result with convergence. As will become apparent, if each bit within the s number K-bit tuple is analyzed without reaching a decode result, an outer loop can cause other K-bit tuples to be scanned and can cause the bits of the K-bit tuples to be repeatedly scanned.

At block 468, a determination is made whether the tuple number variable s is less than the number of tuples to be decoded S. If so, the flow loops back to block 406 of FIG. 4A to analyze another K-bit tuple. If not, at block 470, the loop count variable iter is incremented by one. The loop formed by looping the flow from block 468 to block 406 can permit the flow to analyze each K-bit tuple to be decoded to attempt to reach a decode result with convergence.

At block 472, a determination is made whether the loop count variable iter is less than the maximum number of iterations. The maximum number of iterations can be an arbitrary number of iterations to be performed before the data to be decoded is deemed to be unable to be decoded. If the loop count variable iter is less than the maximum number of iterations, the flow loops back to block 404 in FIG. 4A. If, at block 472, the loop count variable iter is determined to not be less than the maximum number of iterations, at block 474, a decode failure is determined. At block 474, an exception can be thrown, and for example, the data to be decoded is passed to the HG decoder 116 for error correction and decoding.

Any number of variations may be made to the methods implemented by flow charts 400A, 400B of FIGS. 4A and 4B. For example, instead of iteratively processing different bit locations, any number of bit locations can be processed in parallel in some instances. Further, the bit location variables, loop counter, and logic implemented by various determinations can be modified to achieve equivalent functionality.

Figure 5:
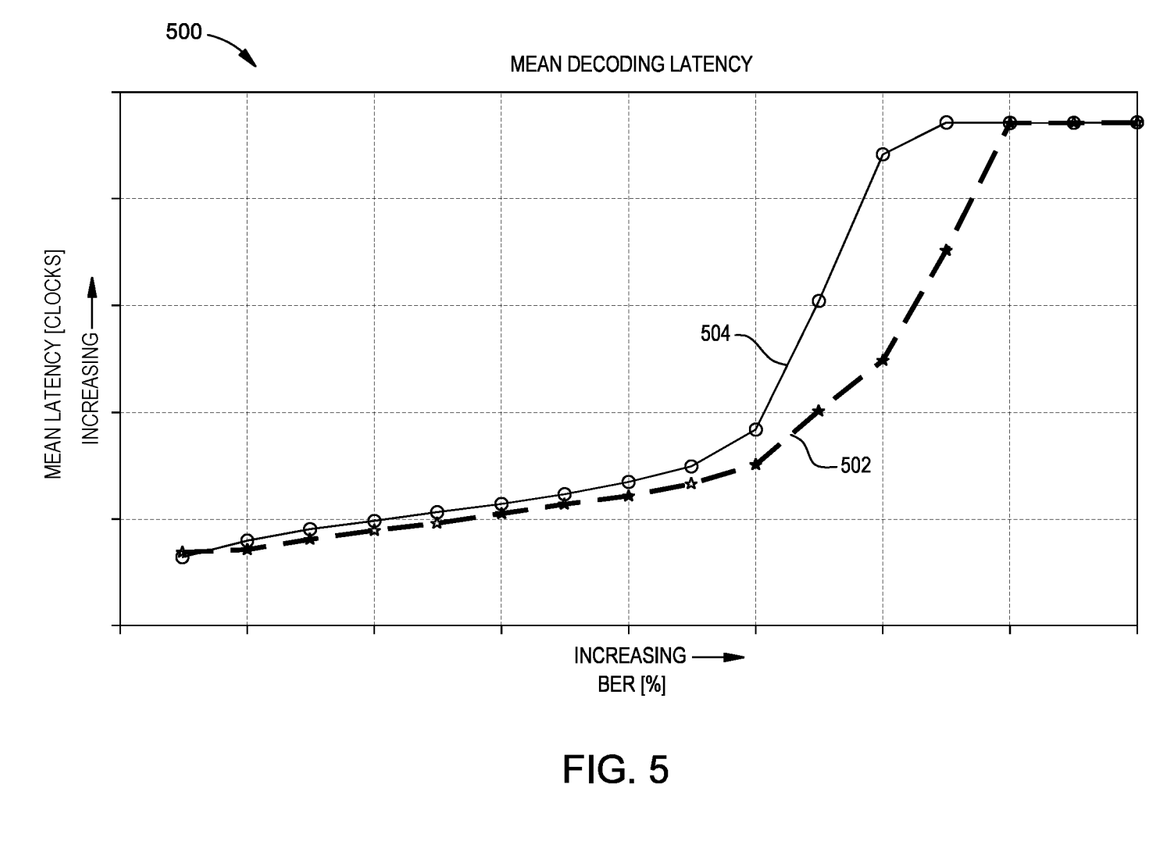
FIG. 5 is a graph of simulation results showing latency.
Figure 6:
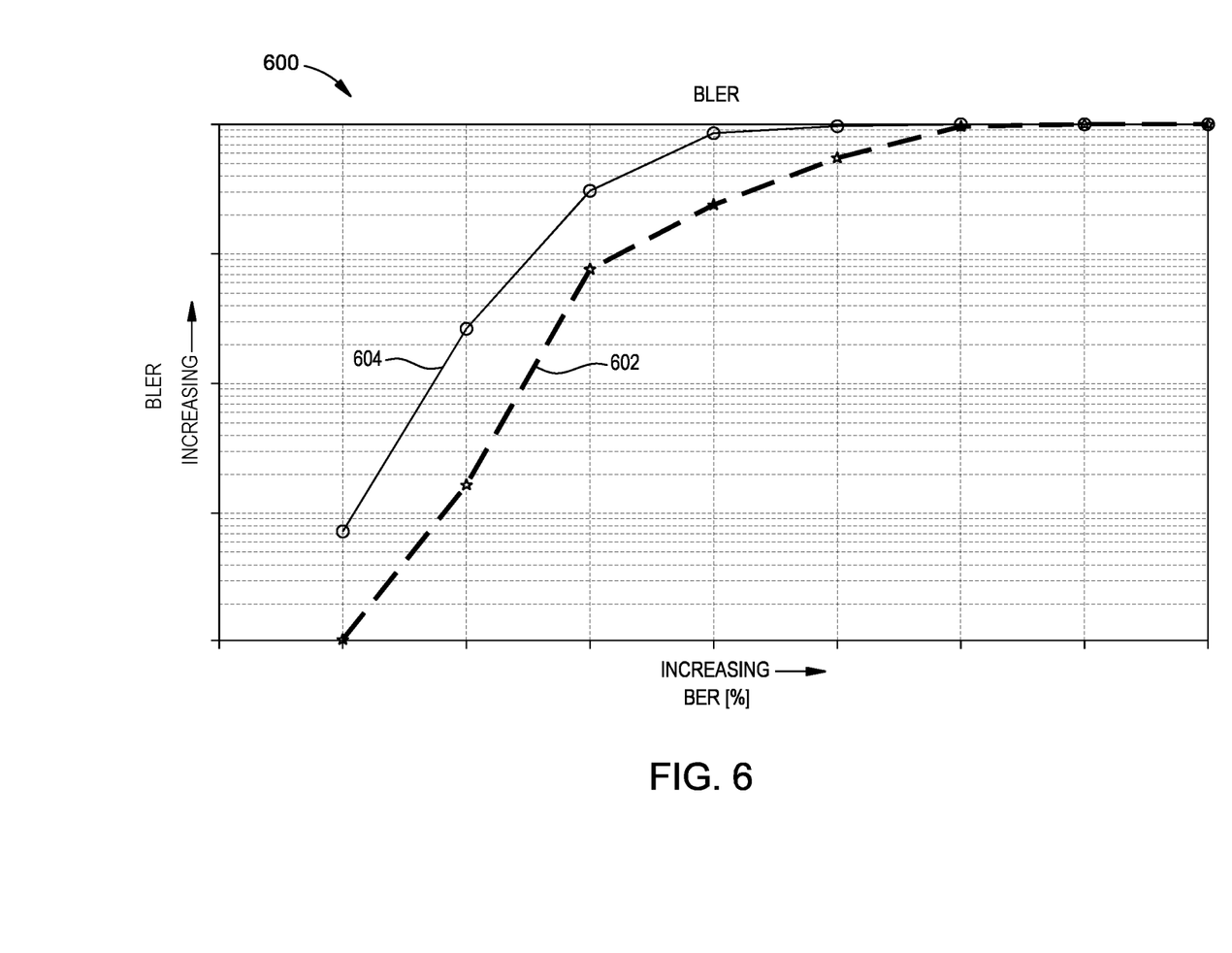
FIG. 6 is a graph of simulation results showing correction capability.

FIGS. 5 and 6 are graphs 500, 600 of simulation results comparing an example implementation of a decoder as described herein to a conventional decoder. The graph 500 of FIG. 5 shows mean latency as a function of bit error rate (BER). The graph 600 of FIG. 6 shows block error rate (BLER) (e.g., indicative of the probability of a decoding failure) as a function of BER. Curves 502, 602 in the graphs 500, 600 represent results of the example implementation of the decoder. Curves 504, 604 in the graphs 500, 600 represent results of the conventional decoder. The simulation of FIGS. 5 and 6 were obtained using a dataset recorded on 128 sequential flash memory units (FMUs) during regular use. An 8-bit tuple and corresponding histogram was used for the example implementation of the decoder.

As shown by FIG. 5, the example implementation has reduced decoding latency. The latency can be reduced for lower BER values and for intermediate BER values. It is anticipated that the example implementation of the decoder will likely be performing with data having the lower BER values for most of the lifetime of the decoder.

As shown by FIG. 6, the example implementation has increased correction capability. For lower BER values, the BLER can be approximately an order of magnitude lower for the example implementation compared to the conventional decoder. Additionally, decode thresholds (e.g., the data with a BER that can be decoded before a given BLER is reached) for the example implementation were increased.

Generally, using statistics to decode and error correct data by, e.g., the LG decoder 114 can decrease latency and increase correction capability. This can improve performance of bit flipping decoders, e.g., at lower BERs, at low power consumption. Processing the flip thresholds can permit decoding and error correction in fewer iterations and allow bit flipping algorithms to be implemented for higher BERs.

According to some examples, a device includes a decoder configured to: process one or more flip thresholds based on statistics of data to be decoded; and perform a bit flipping algorithm on the data using the one or more processed flip thresholds.

In further examples of the above device, the decoder can further be configured to generate the statistics of the data.

In further examples of the above device, the statistics can include probability difference metrics, each probability difference metric of the probability difference metrics being based on two probabilities corresponding to respective bit-difference values, each of the two probabilities being a probability that a given K-bit tuple in the data has a respective value, the respective bit-difference values of the two probabilities being represented by a K-bit tuple having same respective values for corresponding (K−1) bit locations and having different values for one bit location. Further, in some examples, the decoder can be configured to: increase a respective flip threshold corresponding to a bit location of a K-bit tuple of the data when a probability difference metric corresponding to values represented by the K-bit tuple of the data with different bit values at the bit location exceeds a first confidence threshold corresponding to a '1' and a bit value at the bit location is a '1', or when the probability difference metric exceeds a second confidence threshold corresponding to a '0' and the bit value is a '0'; and decrease the respective flip threshold corresponding to the bit location when the probability difference metric exceeds the first confidence threshold and the bit value is a '0', or when the probability difference metric exceeds the second confidence threshold and the bit value is a '1'.

In further examples of the above device, the decoder can be configured to: increase a respective flip threshold corresponding to a bit location of a K-bit tuple when the statistics indicate that a bit value at the bit location is more likely to be correct with a degree of confidence; and decrease the respective flip threshold when the statistics indicate that the bit value is more likely to be incorrect with a degree of confidence.

In further examples of the above device, the decoder can be configured to: determine a number of unsatisfied parity check equations in which a bit value of the data participates; and flip the bit value of the data when the number of unsatisfied parity check equations in which the bit value participates exceeds a respective flip threshold corresponding to a bit location of the bit value.

In further examples of the above device, the bit flipping algorithm can include a low density parity check (LDPC).

According to some examples, a device includes a decoder configured to: obtain data; determine statistics of the data; adjust one or more flip thresholds based on the data statistics; perform check equations on the data; and flip one or more bit values of the data based on the one or more flip thresholds and results of the check equations.

In further examples of the above device, the decoder can be configured to: generate a histogram including bins, each bin of the bins corresponding to a respective bin value represented by K-bits, each bin of the bins having a number of instances in the data where K-bit tuples have the respective bin value; determine, for each bin value, a probability that a given K-bit tuple in the data has the respective bin value based on the histogram; and generate probability difference metrics, each probability difference metric of the probability difference metrics being based on a respective two of the probabilities corresponding to respective bit-difference values, the respective bit-difference values being represented by a K-bit tuple having same respective values for corresponding (K−1) bit locations and having different values for one bit location, wherein adjusting the one or more flip thresholds is based on the probability difference metrics. Further, in some examples, each probability difference metric of the probability difference metrics can be a difference between the respective two of the probabilities. Further, in some examples, each probability difference metric of the probability difference metrics can be a logarithm of a ratio of the respective two of the probabilities. Further, in some examples, the decoder can be configured to, for a bit location of a K-bit tuple of the data: determine whether a probability difference metric of the probability difference metrics exceeds a first confidence threshold corresponding to a degree of confidence that a bit value is '0', the probability difference metric being based on the probabilities corresponding to bit-difference values represented by bit values of the K-bit tuple of the data with a bit value of the respective bit location being '0' and being '1'; determine whether the probability difference metric exceeds a second confidence threshold corresponding to a degree of confidence that a bit value is '1'; increase the respective flip threshold corresponding to the respective bit location when (i) the probability difference metric exceeds the first confidence threshold and the bit value of the respective bit location is '0', or (ii) the probability difference metric exceeds the second confidence threshold and the bit value of the respective bit location is '1'; and decrease the respective flip threshold when (i) the probability difference metric exceeds the first confidence threshold and the bit value of the respective bit location is '1', or (ii) the probability difference metric exceeds the second confidence threshold and the bit value of the respective bit location is '0'.

In further examples of the above device, the decoder can be configured to, for a bit location of a K-bit tuple of the data: determine whether the statistics indicate that a bit value of the respective bit location is more likely to be correct or erroneous with a degree of confidence; and adjust the respective flip threshold corresponding to the respective bit location when the statistics indicate that the bit value is more likely to be correct or erroneous with the degree of confidence.

In further examples of the above device, the decoder can be configured to, for a bit location of a K-bit tuple of the data: determine whether the statistics indicate that a probability that a bit value of the respective bit location is '1' exceeds a first confidence threshold; determine whether the statistics indicate that the probability that the bit value is '0' exceeds a second confidence threshold; increase the respective flip threshold corresponding to the respective bit location when (i) the statistics indicate that the probability that the bit value is '1' exceeds the first confidence threshold and the bit value is '1', or (ii) the statistics indicate that the probability that the bit value is '0' exceeds the second confidence threshold and the bit value is '0'; and decrease the respective flip threshold when (i) the statistics indicate that the probability that the bit value is '1' exceeds the first confidence threshold and the bit value is '0', or (ii) the statistics indicate that the probability that the bit value is '0' exceeds the second confidence threshold and the bit value is '1'.

In further examples of the above device, each of the one or more bit values of the data can be flipped when a number of unsatisfied check equations in which the respective bit value participates exceeds a respective flip threshold corresponding to a bit location of the respective bit value.

In further examples of the above device, the check equations can be at least part of a low density parity check (LDPC).

According to some examples, a device includes means for obtaining data; means for generating statistics of the data; means for processing one or more flip thresholds based on the data statistics; and means for performing a bit flipping algorithm on the data based on the processed one or more flip thresholds.

In further examples of the above device, the means for generating the statistics can include means for generating probability difference metrics for the data, each probability difference metric of the probability difference metrics corresponding to a representation of a difference between probabilities of K-bit tuples having respective values in the data, the respective values being a K-bit tuple having same bit values at corresponding (K−1) bit locations and having different bit values at one bit location. Further, the means for processing the one or more flip thresholds can include means for increasing and decreasing a respective flip threshold of the one or more flip thresholds based on a comparison of a respective probability difference metric of the probability difference metrics with a confidence threshold, the respective flip threshold corresponding to a bit location of a K-bit tuple, the respective probability difference metric corresponding to respective values of the K-bit tuple having different bit values at the bit location.

In further examples of the above device, the bit flipping algorithm can include a low density parity check (LDPC).

According to some examples, a method includes: processing one or more flip thresholds based on statistics of data to be decoded; and performing a bit flipping algorithm on the data using the one or more processed flip thresholds.

In further examples, the above method can include generating the statistics of the data.

In further examples of the above method, the statistics can include probability difference metrics, each probability difference metric of the probability difference metrics being based on two probabilities corresponding to respective bit-difference values, each of the two probabilities being a probability that a given K-bit tuple in the data has a respective value, the respective bit-difference values of the two probabilities being represented by a K-bit tuple having same respective values for corresponding (K−1) bit locations and having different values for one bit location. Further, in some examples, the method can include: increasing a respective flip threshold corresponding to a bit location of a K-bit tuple of the data when a probability difference metric corresponding to values represented by the K-bit tuple of the data with different bit values at the bit location exceeds a first confidence threshold corresponding to a '1' and a bit value at the bit location is a '1', or when the probability difference metric exceeds a second confidence threshold corresponding to a '0' and the bit value is a '0'; and decreasing the respective flip threshold corresponding to the bit location when the probability difference metric exceeds the first confidence threshold and the bit value is a '0', or when the probability difference metric exceeds the second confidence threshold and the bit value is a '1'.

In further examples, the above method can include increasing a respective flip threshold corresponding to a bit location of a K-bit tuple when the statistics indicate that a bit value at the bit location is more likely to be correct with a degree of confidence; and decreasing the respective flip threshold when the statistics indicate that the bit value is more likely to be incorrect with a degree of confidence.

In further examples, the above method can include: determining a number of unsatisfied parity check equations in which a bit value of the data participates; and flipping the bit value of the data when the number of unsatisfied parity check equations in which the bit value participates exceeds a respective flip threshold corresponding to a bit location of the bit value.

In further examples of the above method, the bit flipping algorithm can include a low density parity check (LDPC).

According to some examples, a method includes: obtaining data; determining statistics of the data; adjusting one or more flip thresholds based on the data statistics; performing check equations on the data; and flipping one or more bit values of the data based on the one or more flip thresholds and results of the check equations.

In further examples, the above method can include: generating a histogram including bins, each bin of the bins corresponding to a respective bin value represented by K-bits, each bin of the bins having a number of instances in the data where K-bit tuples have the respective bin value; determining, for each bin value, a probability that a given K-bit tuple in the data has the respective bin value based on the histogram; and generating probability difference metrics, each probability difference metric of the probability difference metrics being based on a respective two of the probabilities corresponding to respective bit-difference values, the respective bit-difference values being represented by a K-bit tuple having same respective values for corresponding (K−1) bit locations and having different values for one bit location, wherein adjusting the one or more flip thresholds is based on the probability difference metrics. Further, in some examples, each probability difference metric of the probability difference metrics can be a difference between the respective two of the probabilities. Further, in some examples, each probability difference metric of the probability difference metrics can be a logarithm of a ratio of the respective two of the probabilities. Further, in some examples, the method can include, for a bit location of a K-bit tuple of the data: determining whether a probability difference metric of the probability difference metrics exceeds a first confidence threshold corresponding to a degree of confidence that a bit value is '0', the probability difference metric being based on the probabilities corresponding to bit-difference values represented by bit values of the K-bit tuple of the data with a bit value of the respective bit location being '0' and being '1'; determining whether the probability difference metric exceeds a second confidence threshold corresponding to a degree of confidence that a bit value is '1'; increasing the respective flip threshold corresponding to the respective bit location when (i) the probability difference metric exceeds the first confidence threshold and the bit value of the respective bit location is '0', or (ii) the probability difference metric exceeds the second confidence threshold and the bit value of the respective bit location is '1'; and decreasing the respective flip threshold when (i) the probability difference metric exceeds the first confidence threshold and the bit value of the respective bit location is '1', or (ii) the probability difference metric exceeds the second confidence threshold and the bit value of the respective bit location is '0'.

In further examples, the above method can include, for a bit location of a K-bit tuple of the data: determining whether the statistics indicate that a bit value of the respective bit location is more likely to be correct or erroneous with a degree of confidence; and adjusting the respective flip threshold corresponding to the respective bit location when the statistics indicate that the bit value is more likely to be correct or erroneous with the degree of confidence.

In further examples, the above method can include, for a bit location of a K-bit tuple of the data: determining whether the statistics indicate that a probability that a bit value of the respective bit location is '1' exceeds a first confidence threshold; determining whether the statistics indicate that the probability that the bit value is '0' exceeds a second confidence threshold; increasing the respective flip threshold corresponding to the respective bit location when (i) the statistics indicate that the probability that the bit value is '1' exceeds the first confidence threshold and the bit value is '1', or (ii) the statistics indicate that the probability that the bit value is '0' exceeds the second confidence threshold and the bit value is '0'; and decreasing the respective flip threshold when (i) the statistics indicate that the probability that the bit value is '1' exceeds the first confidence threshold and the bit value is '0', or (ii) the statistics indicate that the probability that the bit value is '0' exceeds the second confidence threshold and the bit value is '1'.

In further examples of the above method, each of the one or more bit values of the data can be flipped when a number of unsatisfied check equations in which the respective bit value participates exceeds a respective flip threshold corresponding to a bit location of the respective bit value.

In further examples of the above method, the check equations can be at least part of a low density parity check (LDPC).

According to some examples, a method includes obtaining data; generating statistics of the data; processing one or more flip thresholds based on the data statistics; and performing a bit flipping algorithm on the data based on the processed one or more flip thresholds.

In further examples of the above method, generating the statistics can include means for generating probability difference metrics for the data, each probability difference metric of the probability difference metrics corresponding to a representation of a difference between probabilities of K-bit tuples having respective values in the data, the respective values being a K-bit tuple having same bit values at corresponding (K-1) bit locations and having different bit values at one bit location. Further, processing the one or more flip thresholds can include increasing and decreasing a respective flip threshold of the one or more flip thresholds based on a comparison of a respective probability difference metric of the probability difference metrics with a confidence threshold, the respective flip threshold corresponding to a bit location of a K-bit tuple, the respective probability difference metric corresponding to respective values of the K-bit tuple having different bit values at the bit location.

In further examples of the above method, the bit flipping algorithm can include a low density parity check (LDPC).

While the foregoing is directed to embodiments of the present disclosure, other and further embodiments of the disclosure may be devised without departing from the basic scope thereof, and the scope thereof is determined by the claims that follow.

What is claimed is:

1. A device, comprising:
    a decoder configured to:
        process one or more flip thresholds based on statistics of data to be decoded, wherein processing the one or more flip thresholds comprises adjusting the one or more flip thresholds based on the statistics of the data to be decoded, wherein the adjusting comprises increasing the one or more flip thresholds when the statistics indicate that a bit value at the bit location is more likely to be correct with a degree of confidence and decreasing the one or more flip thresholds when the statistics indicate that the bit value is more likely to be incorrect with a degree of confidence; and
        perform a bit flipping algorithm on the data using the one or more processed flip thresholds.

2. The device of claim 1, wherein the decoder is further configured to generate the statistics of the data.

3. The device of claim 1, wherein the decoder is configured to:
    determine a number of unsatisfied parity check equations in which a bit value of the data participates; and
    flip the bit value of the data when the number of unsatisfied parity check equations in which the bit value participates exceeds a respective flip threshold corresponding to a bit location of the bit value.

4. The device of claim 1, wherein the bit flipping algorithm includes a low density parity check (LDPC).

5. A device, comprising:
    a decoder configured to:
        process one or more flip thresholds based on statistics of data to be decoded, wherein the statistics include probability difference metrics, each probability difference metric of the probability difference metrics being based on two probabilities corresponding to respective bit-difference values, each of the two probabilities being a probability that a given K-bit tuple in the data has a respective value, the respective bit-difference values of the two probabilities being represented by a K-bit tuple having same respective values for corresponding (K-1) bit locations and having different values for one bit location; and
        perform a bit flipping algorithm on the data using the one or more processed flip thresholds.

6. The device of claim 5, wherein the decoder is configured to:
    increase a respective flip threshold corresponding to a bit location of a K-bit tuple of the data when a probability difference metric corresponding to values represented by the K-bit tuple of the data with different bit values at the bit location exceeds a first confidence threshold corresponding to a '1' and a bit value at the bit location is a '1', or when the probability difference metric exceeds a second confidence threshold corresponding to a '0' and the bit value is a '0'; and decrease the respective flip threshold corresponding to the bit location when the probability difference metric exceeds the first confidence threshold and the bit value is a '0', or when the probability difference metric exceeds the second confidence threshold and the bit value is a '1'.

7. A device, comprising:
a decoder configured to:
process one or more flip thresholds based on statistics of data to be decoded;
perform a bit flipping algorithm on the data using the one or more processed flip thresholds;
increase a respective flip threshold corresponding to a bit location of a K-bit tuple when the statistics indicate that a bit value at the bit location is more likely to be correct with a degree of confidence; and
decrease the respective flip threshold when the statistics indicate that the bit value is more likely to be incorrect with a degree of confidence.

8. A device, comprising:
a decoder configured to:
obtain data;
determine statistics of the data;
adjust one or more flip thresholds based on the data statistics, wherein the adjusting comprises increasing the one or more flip thresholds when the statistics indicate that a bit value at the bit location is more likely to be correct with a degree of confidence and decreasing the one or more flip thresholds when the statistics indicate that the bit value is more likely to be incorrect with a degree of confidence;
perform check equations on the data; and
flip one or more bit values of the data based on the one or more flip thresholds and results of the check equations.

9. The device of claim 8, wherein:
each of the one or more bit values of the data is flipped when a number of unsatisfied check equations in which the respective bit value participates exceeds a respective flip threshold corresponding to a bit location of the respective bit value.

10. The device of claim 8, wherein the check equations are at least part of a low density parity check (LDPC).

11. A device, comprising:
a decoder configured to:
obtain data;
determine statistics of the data;
adjust one or more flip thresholds based on the data statistics;
perform check equations on the data;
flip one or more bit values of the data based on the one or more flip thresholds and results of the check equations;
generate a histogram including bins, each bin of the bins corresponding to a respective bin value represented by K-bits, each bin of the bins having a number of instances in the data where K-bit tuples have the respective bin value;
determine, for each bin value, a probability that a given K-bit tuple in the data has the respective bin value based on the histogram; and
generate probability difference metrics, each probability difference metric of the probability difference metrics being based on a respective two of the probabilities corresponding to respective bit-difference values, the respective bit-difference values being represented by a K-bit tuple having same respective values for corresponding (K−1) bit locations and having different values for one bit location, wherein adjusting the one or more flip thresholds is based on the probability difference metrics.

12. The device of claim 11, wherein each probability difference metric of the probability difference metrics is a difference between the respective two of the probabilities.

13. The device of claim 11, wherein each probability difference metric of the probability difference metrics is a logarithm of a ratio of the respective two of the probabilities.

14. The device of claim 11, wherein the decoder is configured to, for a bit location of a K-bit tuple of the data:
determine whether a probability difference metric of the probability difference metrics exceeds a first confidence threshold corresponding to a degree of confidence that a bit value is '0', the probability difference metric being based on the probabilities corresponding to bit-difference values represented by bit values of the K-bit tuple of the data with a bit value of the respective bit location being '0' and being '1';
determine whether the probability difference metric exceeds a second confidence threshold corresponding to a degree of confidence that a bit value is '1';
increase the respective flip threshold corresponding to the respective bit location when (i) the probability difference metric exceeds the first confidence threshold and the bit value of the respective bit location is '0', or (ii) the probability difference metric exceeds the second confidence threshold and the bit value of the respective bit location is '1'; and
decrease the respective flip threshold when (i) the probability difference metric exceeds the first confidence threshold and the bit value of the respective bit location is '1', or (ii) the probability difference metric exceeds the second confidence threshold and the bit value of the respective bit location is '0'.

15. A device, comprising:
a decoder configured to:
obtain data;
determine statistics of the data;
adjust one or more flip thresholds based on the data statistics;
perform check equations on the data; and
flip one or more bit values of the data based on the one or more flip thresholds and results of the check equations, wherein the decoder is further configured to, for a bit location of a K-bit tuple of the data:
determine whether the statistics indicate that a bit value of the respective bit location is more likely to be correct or erroneous with a degree of confidence; and
adjust the respective flip threshold corresponding to the respective bit location when the statistics indicate that the bit value is more likely to be correct or erroneous with the degree of confidence.

16. A device, comprising:
a decoder configured to:
obtain data;
determine statistics of the data;
adjust one or more flip thresholds based on the data statistics;

perform check equations on the data; and flip one or more bit values of the data based on the one or more flip thresholds and results of the check equations, wherein the decoder is further configured to, for a bit location of a K-bit tuple of the data:

determine whether the statistics indicate that a probability that a bit value of the respective bit location is '1' exceeds a first confidence threshold;

determine whether the statistics indicate that the probability that the bit value is '0' exceeds a second confidence threshold;

increase the respective flip threshold corresponding to the respective bit location when (i) the statistics indicate that the probability that the bit value is '1' exceeds the first confidence threshold and the bit value is '1', or (ii) the statistics indicate that the probability that the bit value is '0' exceeds the second confidence threshold and the bit value is '0'; and decrease the respective flip threshold when (i) the statistics indicate that the probability that the bit value is '1' exceeds the first confidence threshold and the bit value is '0', or (ii) the statistics indicate that the probability that the bit value is '0' exceeds the second confidence threshold and the bit value is '1'.

17. A device, comprising:

means for obtaining data;

means for generating statistics of the data;

means for processing one or more flip thresholds based on the data statistics, wherein the means for processing the one or more flip thresholds comprises adjusting the one or more flip thresholds based on the data statistics, wherein the adjusting comprises increasing the one or more flip thresholds when the statistics indicate that a bit value at the bit location is more likely to be correct with a degree of confidence and decreasing the one or more flip thresholds when the statistics indicate that the bit value is more likely to be incorrect with a degree of confidence; and means for performing a bit flipping algorithm on the data based on the processed one or more flip thresholds.

18. The device of claim 17, wherein the means for generating the statistics includes means for generating probability difference metrics for the data, each probability difference metric of the probability difference metrics corresponding to a representation of a difference between probabilities of K-bit tuples having respective values in the data, the respective values being a K-bit tuple having same bit values at corresponding (K−1) bit locations and having different bit values at one bit location.

19. The device of claim 18, wherein the means for processing the one or more flip thresholds includes means for increasing and decreasing a respective flip threshold of the one or more flip thresholds based on a comparison of a respective probability difference metric of the probability difference metrics with a confidence threshold, the respective flip threshold corresponding to a bit location of a K-bit tuple, the respective probability difference metric corresponding to respective values of the K-bit tuple having different bit values at the bit location.

20. The device of claim 17, wherein the bit flipping algorithm includes a low density parity check (LDPC).

* * * * *